(12) United States Patent
Kohashi

(10) Patent No.: US 10,395,885 B2
(45) Date of Patent: Aug. 27, 2019

(54) CHARGED PARTICLE DEVICE, CHARGED PARTICLE IRRADIATION METHOD, AND ANALYSIS DEVICE

(71) Applicant: HITACHI, LTD., Chiyoda-ku, Tokyo (JP)

(72) Inventor: Teruo Kohashi, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 15/736,098

(22) PCT Filed: Jun. 23, 2015

(86) PCT No.: PCT/JP2015/067935
§ 371 (c)(1),
(2) Date: Dec. 13, 2017

(87) PCT Pub. No.: WO2016/207961
PCT Pub. Date: Dec. 29, 2016

(65) Prior Publication Data
US 2018/0174795 A1 Jun. 21, 2018

(51) Int. Cl.
*H01J 37/09* (2006.01)
*H01J 37/04* (2006.01)
(Continued)

(52) U.S. Cl.
CPC ............. *H01J 37/09* (2013.01); *H01J 37/04* (2013.01); *H01J 37/147* (2013.01); *H01J 37/20* (2013.01);
(Continued)

(58) Field of Classification Search
CPC ... H01J 2237/24557; H01J 2237/06383; H01J 2237/06333; H01J 2237/1505;
(Continued)

(56) References Cited

U.S. PATENT DOCUMENTS

2007/0194230 A1* 8/2007 Kohashi ................. H01J 37/29
250/310
2008/0210868 A1* 9/2008 Kohashi ................. H01J 37/265
250/311
(Continued)

FOREIGN PATENT DOCUMENTS

JP 11-295497 A 10/1999
JP 2007-225363 A 9/2007
(Continued)

OTHER PUBLICATIONS

E. Bauer et al.; "Spin-polarized low energy electron microscopy of ferromagnetic thin films", Journal of Physics D: Applied Physics 35; Institute of Physics Publishing; pp. 2327-2331; Sep. 13, 2002.

*Primary Examiner* — David A Vanore
(74) *Attorney, Agent, or Firm* — Miles & Stockbridge PC

(57) ABSTRACT

Provided is an optical system which can adjust, including increase, a spin polarization degree of an electron beam. Disclosed is a charged particle device having a charged particle source which generates charged particles, a sample table on which a sample is placed, and a transport optical system which is disposed between the charged particle source and the sample table and transports the charged particles as charged particle flux toward the sample table. In this device, the transport optical system includes a magnetic field generating section which generates a magnetic field having a vertical component to a course of the charged particle flux, an electric field generating section which generates an electric field having a vertical component to the course of the charged particle flux, and a shielding section which shields at least a part of the charged particle flux passed through the magnetic field generating section and the electric field generating section. Moreover, the vertical component of the magnetic field has a magnetic field gradient, and the vertical component of the electric field gives an
(Continued)

electrostatic force in a direction opposite to a Lorentz force received by the charged particle flux.

13 Claims, 10 Drawing Sheets

(51) Int. Cl.
 *H01J 37/147* (2006.01)
 *H01J 37/28* (2006.01)
 *H01J 37/20* (2006.01)
(52) U.S. Cl.
 CPC ......... *H01J 37/28* (2013.01); *H01J 2237/041* (2013.01)
(58) Field of Classification Search
 CPC ......... H01J 2237/041; H01J 2237/2067; H01J 2237/24564; H01J 2237/2538; H01J 2237/2588; H01J 2237/2614; H01J 37/26; H01J 37/265; H01J 37/266; H01J 37/073; H01J 37/244; H01J 37/285; H01J 37/29; H01J 37/145; H01J 49/288; H01J 1/50; G01N 23/2251
 USPC ..... 250/310, 311, 251, 305, 306, 307, 492.1
 See application file for complete search history.

(56) References Cited

U.S. PATENT DOCUMENTS

| | | | |
|---|---|---|---|
| 2008/0217533 A1* | 9/2008 | Kohashi | G01N 23/2251 250/310 |
| 2010/0155598 A1* | 6/2010 | Kohashi | B82Y 25/00 250/311 |
| 2013/0009058 A1* | 1/2013 | Tanaka | H01J 37/073 250/311 |
| 2014/0197734 A1* | 7/2014 | Yasue | H01J 1/50 315/111.81 |
| 2014/0346354 A1* | 11/2014 | Verbeeck | H01J 37/04 250/307 |
| 2017/0309446 A1* | 10/2017 | Kuwahara | H01J 37/26 |

FOREIGN PATENT DOCUMENTS

| | | |
|---|---|---|
| JP | 2008-251525 A | 10/2008 |
| JP | 2010-03450 A | 1/2010 |
| JP | 2010-146968 A | 7/2010 |
| JP | 2011-181223 A | 9/2011 |
| WO | WO 2012/173007 A1 | 12/2012 |

* cited by examiner

CHARGED PARTICLE DEVICE, CHARGED PARTICLE IRRADIATION METHOD, AND ANALYSIS DEVICE

TECHNICAL FIELD

The present invention relates to a technique for handling charged particles having spins.

BACKGROUND ART

In addition to electric charge, electrons have physical quantities called spins, which are the origin of magnetism. That is, when the electron spins inside a substance are deviated in a certain direction, that is, when spin polarization occurs, the substance has magnetism.

Hereinafter, the distribution of charged particles having upward spins and charged particles having downward spins is called "spin distribution," and that the spin distribution is deviated (not uniform) is called "spin polarization." Moreover, the deviation of the ratio of the upward to the downward spins included in the charged particle flux is called a "spin polarization degree."

As for electron beams, a spin-polarized electron beam in which the ratio of the spins included in the electron beam is deviated to one side is utilized as a means for microscopically examining the magnetism of a substance. As for the spin polarization degree, for example, the polarization degree is 100% (completely polarized) when all the spins are upward (or downward) and 0% (not polarized at all) when the numbers of the upward and downward spins are the same.

Recently, a spin-polarized electron beam using a superlattice of GaAs/GaAsP as an electron source have particularly attracted attention because the spin polarization degree thereof exceeds 90% (conventionally about 50%) and the like. New findings are expected to be obtained by irradiating a sample with the spin-polarized electron beam having such a spin polarization degree to observe and measure the sample.

For a transport optical system of this spin-polarized electron beam, an electrostatic lens and a magnetic lens for ordinary electron beams are used, and a spin rotator is also used for rotation in a spin polarization direction. Herein, the transport optical system refers to a system which transports particles generated from a particle beam source, such as electrons, to a measuring or processing sample.

When the spin-polarized electron beam passes through, for example, a nonuniform magnetic field, dispersion occurs in a Larmor rotation angle due to the magnetic field, and thus the polarization degree becomes small. For example, since nonuniform magnetic fields are distributed at the entrance and exit of a magnetic lens and the like often used in the transport optical system, there is a high possibility that the spin polarization degree becomes small as described above. However, currently, there is no transport optical system which intentionally adjusts or increases the spin polarization degree.

As described above, there has been no report on a transport optical system which adjusts the magnitude of the spin polarization degree or a transport optical system which adjusts the trajectories of the electrons depending on the spins.

Note that PTL 1 and 2 disclose detectors capable of highly efficiently decomposing the magnetic moments possessed by charged particles. Moreover, NPL 1 discloses a spin-polarized low energy electron microscopy (SPLEEM) which irradiates a magnetic material with a spin-polarized electron beam to measure the intensity of the reflection electrons thereof.

CITATION LIST

Patent Literatures

PTL 1: JP 2008-251525A
PTL 2: JP 2010-146968A

Non-Patent Literature

NPL 1: Journal of Physics D: Applied Physics 35, p 2327-2331 (2002)

SUMMARY OF INVENTION

Technical Problem

An object of the present invention is to provide a technique capable of achieving adjustment of a spin polarization degree and adjustment of a trajectory depending on spins in a device using charged particles such as electrons and ions as a probe.

Solution to Problem

One aspect of the present invention for solving the aforementioned problem is a charged particle device including a charged particle source which generates charged particles, a sample table on which a sample is placed, and a transport optical system which is disposed between the charged particle source and the sample table and transports the charged particles as charged particle flux toward the sample table.

In this device, the transport optical system includes a magnetic field generating section which generates a magnetic field having a vertical component to a course of the charged particle flux, an electric field generating section which generates an electric field having a vertical component to the course of the charged particle flux, and a shielding section which shields at least a part of the charged particle flux passed through the magnetic field generating section and the electric field generating section. Moreover, the vertical component of the magnetic field has a magnetic field gradient, and the vertical component of the electric field gives an electrostatic force in a direction opposite to a Lorentz force received by the charged particle flux.

Another aspect of the present invention is a charged particle irradiation method for irradiating a sample with charged particles having spins. In this method, an electric field and a magnetic field having components vertical to the trajectories of the charged particles and vertical to each other are generated, the magnetic field has a magnetic field gradient at a position of the trajectories of the charged particles, the electric field is applied so as to weaken a Lorentz force received by the charged particles, and the magnetic field gradient gives the charged particles a change in the trajectories according to the spins thereof.

Still another aspect of the present invention is an analysis device including a charged particle source which generates charged particles, a sample table on which a sample is placed, and a transport optical system which is disposed between the charged particle source and the sample table and transports the charged particles as charged particle flux to the sample. The transport optical system includes a separation optical system, an aperture and an objective lens. The separation optical system includes a magnetic field generating section which generates a magnetic field having a vertical component to a course of the charged particle flux, in which the vertical component has a gradient, and an electric field generating section which generates an electric field having a vertical component to the course of the charged particle flux and the vertical component of the magnetic field. Moreover, the aperture increases a spin polarization degree of the charged particle flux by shielding a part of the charged particle flux that has passed through the separation optical system. The objective lens converges the charged particle flux to irradiate the sample, and particles reflected or generated from the sample by the irradiation are observed with a detector.

Advantageous Effects of Invention

It is possible to provide a transport optical system which adjusts the magnitude of the spin polarization degree and a transport optical system which adjusts the trajectories of the electrons depending on the spins.

DESCRIPTION OF EMBODIMENTS

Examples of the present invention provide an optical system capable of achieving adjustment of trajectories depending on electron spins in a transport optical system of an electron microscope using charged particles as a probe. With this, a spin polarization degree can be controlled. By using such a transport optical system, an observing or processing sample can be irradiated with a charged particle beam having a desired spin polarization degree. To understand Examples, the principle of behavior of charged particles having spins will be described first.

Although not about charged particles, the Stern-Gerlach method has been known for adjusting trajectories of neutrons depending on spins.

Figure 1:
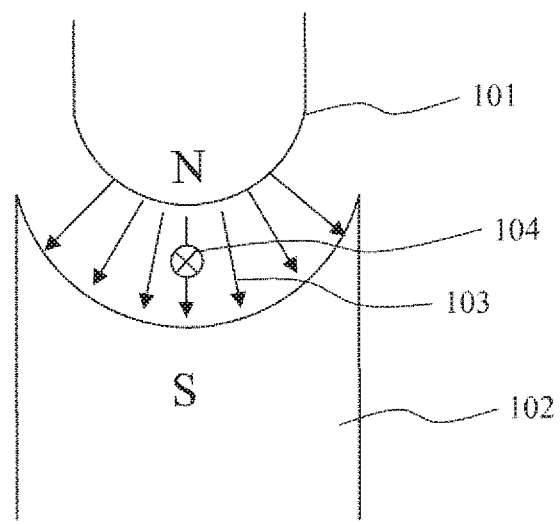
FIGS. 1(a) and 1(b) are a principle diagram showing the Stern-Gerlach method which gives neutrons forces according to spins.
Figure 1:
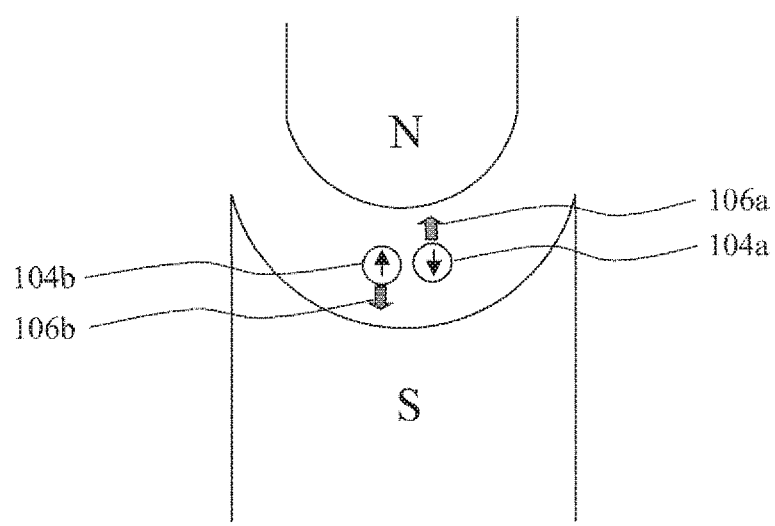

FIGS. 1(a) and 1(b) show the principle of the Stern-Gerlach method. FIG. 1(a) shows positional relationships between magnetic poles and a magnetic field, which is created by the magnetic poles and have a gradient, and a neutron beam. FIG. 1(b) shows the forces that the spins of the neutron beams receive by the magnetic field gradient.

As shown in FIG. 1(a), for example, the magnetic field gradient is formed by magnetic field lines 103 by a magnetic pole (N pole) 101 and a magnetic pole (S pole) 102. In the example of FIG. 1(a), the magnetic field near the N pole 101 is strong (magnetic field lines are dense), and the magnetic field near the S pole 102 is weak (magnetic field lines are sparse).

A neutron 104 is made incident on the front toward the back of the paper into the space having this magnetic field gradient. Then, as shown in FIG. 1(b), a force 106 in the opposite direction is received depending on whether the direction of the spin of the neutron 104 is parallel or antiparallel to the direction of the magnetic field gradient. This force 106 changes the trajectory of the neutron. At this time, even if the force received from the magnetic field gradient is very small, the neutron receives no other forces from the magnetic field. Thus, as shown in FIG. 1(b), the trajectories of the neutrons having different spins become separated due to the forces from the gradient.

As is well known, the spin can probabilistically take two states, upward and downward. The spin is conceptually considered to give the neutrons (particles) the properties of the magnet (magnetic moment). As shown in FIG. 1(b), in the drawing of this Example, the states of the magnetic moments of the particles by the spins are indicated by the arrows. For the sake of explanation, the directions indicated by the arrows correspond to the N pole, and the opposite directions correspond to the S pole. Note that the directions of the spins can also be represented by arrows, and, in a general notation, the arrows indicate directions opposite to the magnetic moments.

In a nonuniform magnetic field, the magnetic moment receives a magnetic force by the magnetic field. For example, as for a neutron 104a on the right side in FIG. 1(b), the neutron is strongly attracted toward the N pole and weakly attracted toward the S pole. Thus, a force 106a ultimately attracted toward the N pole remains. As for a neutron 104b on the left side, the neutron is strongly repelled from the N pole (strongly attracted toward the S pole) and weakly repelled from the S pole (weakly attracted toward the N pole). Thus, a force 106b ultimately attracted toward the S pole remains.

As described above, according to the Stern-Gerlach method, an optical system capable of achieving adjustment of trajectories of neutrons depending on spins can be provided.

However, from the industrial point of view, the Stern-Gerlach method, which handles neutrons, cannot be applied as such to charged particles such as electrons and ions. The reason is that, unlike neutrons which do not have electric charge, charged particles moving in an electromagnetic field receive an enormously large Lorentz force. Thus, the trajectories of the charged particles are greatly bent so that the adjustment of the trajectories depending on electron spins are of no effect. Therefore, the method cannot be used for an electron optical system such as an electron microscope.

Thereupon, the principle of solving the problem of a change in the trajectory by the Lorentz force will be studied.

The solution adopted herein is to apply an electric field having a vertical component in a magnetic field applying direction and a particle trajectory direction.

That is, the electric field is applied in a direction in which the Lorentz force is reduced (ideally canceled) by electrostatic forces. This makes dominant the influence of the forces received by the particles from the magnetic field gradient to change the trajectories of the charged particles. The inventors have already reported a spin detector for separating and detecting the magnetic moments of the charged particles based on this principle (PTL 1).

This method can deviate the spins in the positions thereof in the electron flux (electron beam), such as left and right, up and down, or inside and outside. In this case, even in a non-polarized electron beam, spin polarization can be generated in a part of the electron beam flux. Therefore, by subsequently installing an optical system (a shielding plate, an aperture or the like), which cuts a part of the electron beam flux, after these optical systems, it is possible to transport only a spin-polarized portion to the subsequent optical system and increase the spin polarization degree.

This adjustment of and increase in the spin polarization degree is very useful to increase an S/N in a spin-polarized low energy electron microscopy (SPLEEM) (NPL1) or the like which irradiates a magnetic material with a spin-polarized electron beam to measure the intensity of the reflection electrons thereof.

Hereinafter, the embodiments will be described in detail using the drawings. However, the present invention is not construed as being limited to the following embodiments. Those skilled in the art can easily understand that specific configurations can be changed in a scope without departing from the spirit or gist of the present invention.

In the configurations of the invention described below, the same reference signs are commonly used for the same parts and parts having the same functions in different drawings, and redundant descriptions may be omitted.

The notations such as "first," "second," and "third" in the specification and claims are provided to identify constituent elements and do not necessarily limit the number or order thereof. Moreover, the numbers for identifying the constituent elements are used for each context, and the numbers used in one context does not necessarily indicate the same constituent in other contexts. Furthermore, a constituent element identified by a certain number may have a function of a constituent element identified by a different number.

The positions, sizes, shapes, ranges and the like of the respective constituents shown in the drawings and the specification do not necessarily represent actual positions, sizes, shapes, ranges and the like in order to facilitate understanding of the invention. Therefore, the present invention is not necessarily limited to the positions, sizes, shapes, ranges and the like disclosed in the drawings and the like.

The publications, patents and patent applications cited in the specification constitute a part of the description of the specification as such.

A constituent element expressed in a singular form in the specification include a plural form unless particularly and explicitly indicated in a context.

Example 1

Hereinafter, Examples of the present invention will be described with reference to the drawings.

FIGS. 2(a) and 2(b) show the basic structure of an electron optical system of Example 1. FIG. 2(a) shows relationships among magnetic poles, electrodes and a magnetic field and an electric field which are created by them. FIG. 2(b) shows spins of electrons and forces the spins receive from a magnetic field gradient.

As shown in FIG. 2(a), the magnetic field generated by the magnetic poles having curved surfaces such as a concave surface and a convex surface has a gradient. Since it is difficult to highly accurately create the magnetic poles having curved surfaces, it is also effective to use magnetic poles configured with a plurality of planes approximating curved surfaces.

As shown in FIG. 2(a), like the Stern-Gerlach method, a magnetic pole 201, an N pole, and a magnetic pole 202, an S pole, have different shapes and form a magnetic field gradient. Two electrodes 203 may have the same shape and are disposed so that the surfaces thereof are not parallel but tilted.

Both magnetic field lines 204 and electric field lines 205 generated in such a state have different directions and densities depending on places.

Figure 2:
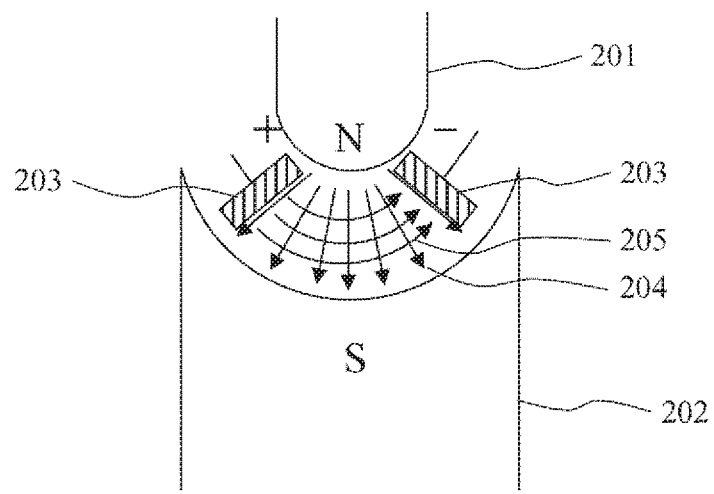
FIGS. 2(a) and 2(b) are a principle diagram showing Example 1 of an electron optical system of the present invention.
Figure 2:
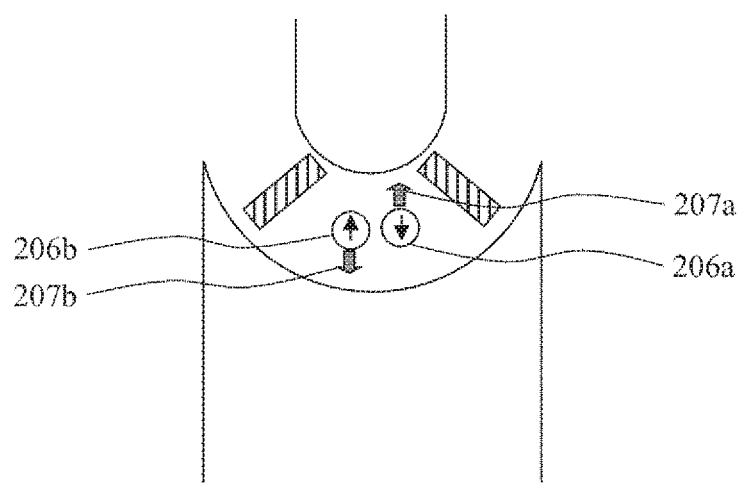

As shown in FIG. 2(b), in this state, an electron 206 is made incident in a vertical direction in the drawing. By the principle described in FIG. 1(b), electrons 206a and 206b receive forces 207a and 207b according to the states of the spins. The basic differences between FIGS. 1(a) to 2(b) and 2 are presence/absence of electric charge of the particles and presence/absence of a configuration for reducing the Lorentz force due to the electric charge. Ideally, it is desirable to cancel the Lorentz force, but only weakening the Lorentz force so as to reduce the influence on the deviations of the trajectories caused by the spins has a predetermined effect.

To change the trajectory by a desired amount by applying a desired force 207 to the electron 206, a desired magnetic field gradient is generated by the magnetic field lines 204. Due to the magnetic field lines 204, the electric charge (elementary charge) of the electron 206 and the kinetic rate of the electron, the electron 206 receive the Lorentz force. In FIG. 2(a), an electrostatic force which cancels the Lorentz force is received from the electric field lines 205.

For example, suppose that the electron 206 are made incident on the front toward the back of the paper as in FIG. 1(a). A rightward Lorentz force is applied to the electron 206, and the trajectory is shifted to the right side. To cancel this force, as shown in FIG. 2(a), a negative electrode is placed on the right side, a positive electrode is placed on the left side, a leftward force is applied to the electron 206 having negative charge, and the trajectory is shifted to the left side.

The shapes, magnetic forces, and voltages of the magnetic poles 201 and 202 and the electrodes 203 for obtaining the magnetic field lines 204 and electric field lines 205 meeting the conditions can be calculated based on classical electromagnetics. For example, when the electrons accelerated at 10 V advance by 1 m in a magnetic field gradient of 1 T/m, the received deflection amount can be calculated as 1.4 um. This deflection amount is proportional to the square of the traveling distance of the electrons in the magnetic field.

When the magnetic field lines 204 and the electric field lines 205 meeting the conditions are obtained, the force received by the electron 206 is only the force 207 received from the magnetic field gradient, and the direction of this force 207 is different depending on the spin of the electron 206 so that differences in the trajectories according to the spins of the electrons can be generated.

Figure 3:
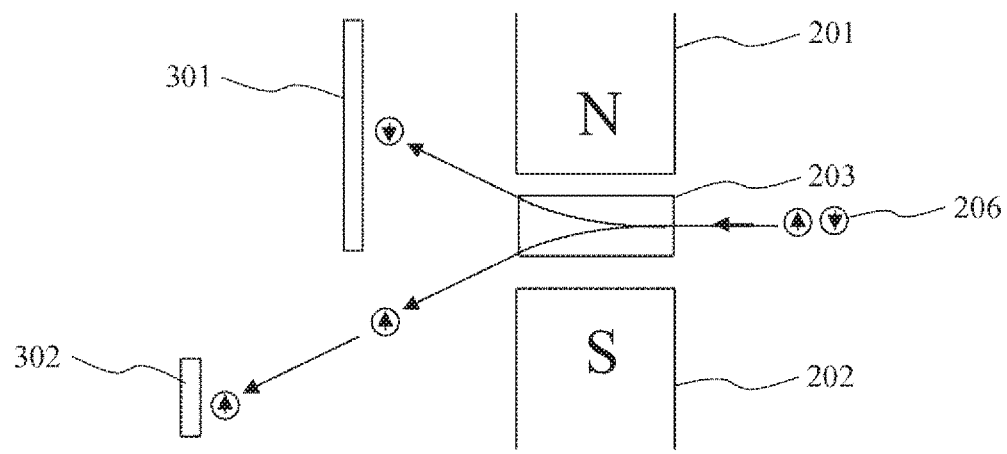
FIG. 3 is a principle diagram showing how the trajectories of electrons are changed in Example 1 of the present invention.

FIG. 3 shows a diagram of Example of the present invention shown in FIGS. 2(a) and 2(b) viewed from the direction of the electric field 205. In this drawing, the electrons 206 are made incident from the right side toward the magnetic poles 201 and 202 and the electrode 203, where the electrons 206 receive the forces according to the directions of the spins from the magnetic field gradient, and the trajectories change while the electrons 206 pass through the magnetic poles 201 and 302 and the electrode 203. In this way, differences in the trajectories according to the spins of the electrons 206 can be generated.

Note that, in FIG. 3, the deviations of the trajectories of the two electrons are largely shown, and the electron flux appears to be separated. However, the magnitude of the deviation amounts of the trajectories can be controlled. By adjusting the deviation amounts to be large, one electron flux can be made into two electron fluxes composed of electrons with different spins. Moreover, by adjusting the deviation amounts to be small, the distribution of the spins can be changed within one electron flux.

When one electron flux is made into two electron fluxes composed of electrons with different spins, it is possible to shield one electron flux with a shielding plate 301 and irradiate a sample 302 with only the other electron flux as shown in FIG. 3. With this configuration, it is possible to irradiate the sample 302 with electron flux with a high spin polarization degree.

Example 2

FIGS. 4(a) to 4(c) show an example of control of the distribution of the spins of the electron beam according to Example 2 of the present invention. The example in FIG. 4(a) shows a state in which electrons having upward and downward spins (or magnetic moments) on the paper are being deviated in the lateral direction.

The magnetic field having the magnetic field gradient can also be generated by applying an electric current to a conductive wire. The concentric magnetic field generated at this time is strong in the vicinity of the conductive wire and gradually weakens as being apart from the conductive wire. In this case, a magnetic field having a gradient in the radial direction of the concentric circle is generated.

As shown in FIG. 4(a), a placoid electrode 401 and an electric current 402 flowing from the back to the front of the paper generate a concentric magnetic field 403. Herein, the traveling direction of electrons incident on the magnetic field 403 is the vertical direction to the paper.

Figure 4:
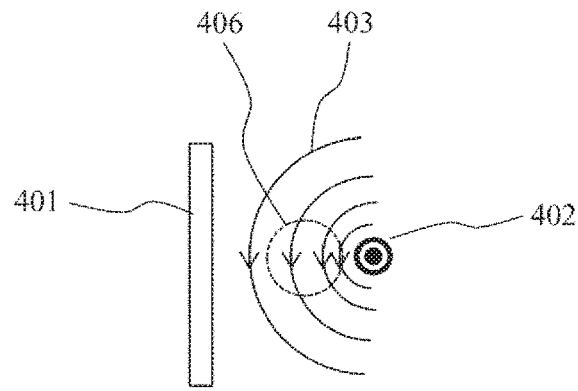
FIGS. 4(a) to 4(c) are a principle diagram showing an electron optical system of Example 2 of the present invention.
Figure 4:
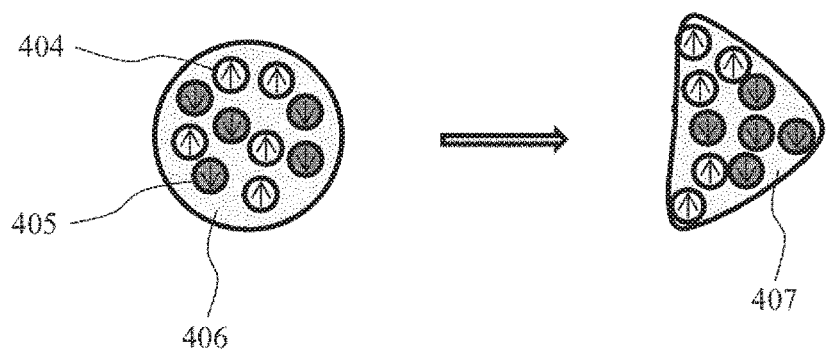
Figure 4:
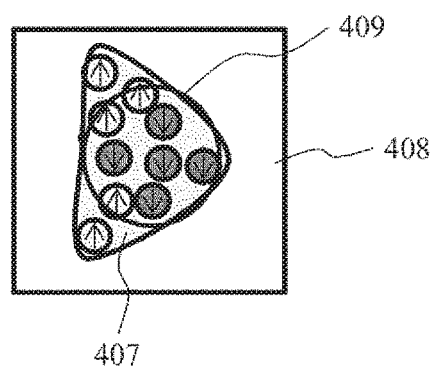

When electron flux formed by a common electron source and a transport electron optical system is used, as shown in FIG. 4 (b), electron flux 406 before being incident on this optical system is circular, and there is no spin polarization inside thereof (upward spins and downward spins are distributed equally and evenly). In this state, when passing through the concentric magnetic field 403 created by the electric current 402, electrons 404 having upward magnetic moments receive forces on the left side, and electrons 405 having downward magnetic moments receive forces on the right side. Moreover, due to the magnetic field gradient, the forces that the electrons 405 having the downward magnetic moments receive on the right side is larger than the other forces.

By the action of the above applications, electron flux 407 after passing through this optical system has a distorted shape with the right side narrowed. This also causes spin polarization in which the electrons 405 having downward spins are deviated to the right side.

At this time, as described with FIGS. 2(a) and 2(b), the electrons 405 receive the Lorentz force by the magnetic field 403. The direction of the Lorentz force depends on the traveling direction of the electrons 405 with respect to the paper, but a positive or negative polarity is given to the placoid electrode 402 so as to apply electrostatic forces to the electrons 405 to cancel out the Lorentz force.

An aperture 408 shown in FIG. 4(c) is applied to the electron flux 407 with the spin polarization shown in FIG. 4(b) to shield a part of the electron flux 407. Since the distribution of the spins in the electron flux 407 is deviated, the spin polarization degree of the electron flux after passing through an opening 409 can be changed.

Example 3

Figure 5:
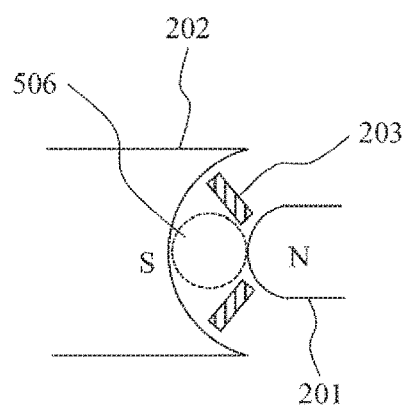
FIGS. 5(a) and 5(b) are a principle diagram showing an electron optical system of Example 3 of the present invention.
Figure 5:
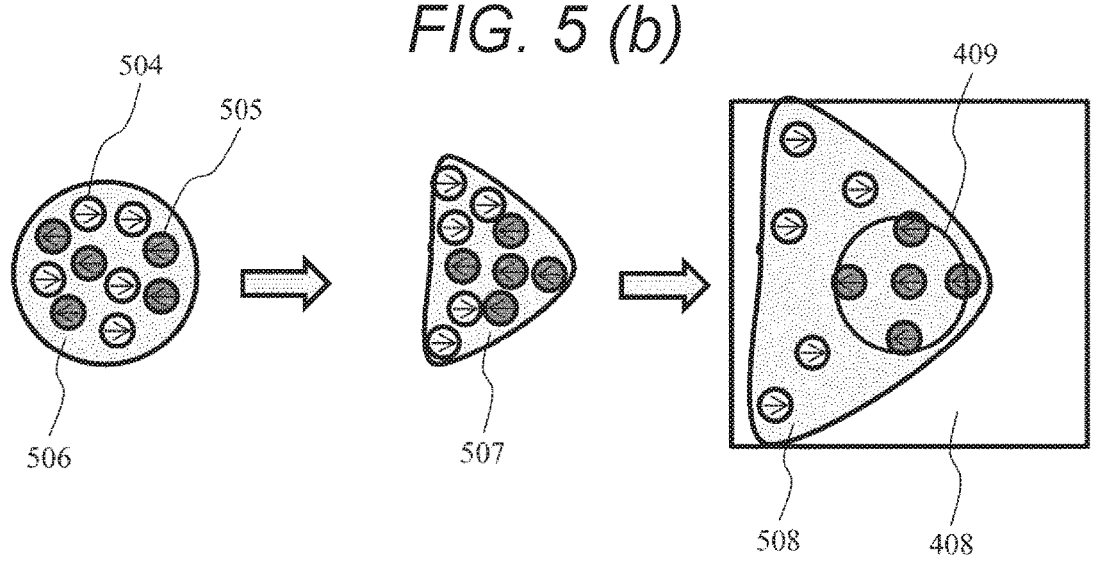

FIGS. 5(a) and 5(b) show Example 3. The basic configuration is the same as in FIGS. 2(a) and 2(b). FIG. 5(b) shows a state in which electrons having leftward and rightward spins (or magnetic moments) on the paper are being deviated in the lateral direction. An electric field created by placoid electrodes 203 and a magnetic field created by a magnetic pole 201 having a convex curved surface and a magnetic pole 202 having a concave curved surface are used.

Herein, the traveling direction of the electrons is the vertical direction to the paper. Electron flux 506 before being incident on this optical system is circular, and there is no spin polarization inside. When passing through an electromagnetic field shown in FIG. 5(a) in this state, electrons 504 having rightward magnetic moments receive forces on the left side where the magnetic field of an S pole 202 is strong, and electron 505 having leftward magnetic moments receive forces on the right side where the magnetic field of an N pole 201 is strong. Moreover, since magnetic field lines are dense toward the N pole 201, the forces the electrons 505 having leftward spins receive on the right side are larger than the other forces.

By the action of the above applications, electron flux 507 after passing through this optical system has a distorted shape with the right side narrowed, resulting in spin polarization in which the electrons 505 having leftward spins are deviated in that direction.

At this time, as described with reference to FIGS. 2(a) and 2(b), the electrons 504 and 505 receive the Lorentz force by the magnetic field. The direction of the Lorentz force depends on the traveling directions of the electrons 504 and 505 with respect to the paper, but a positive or negative polarity is given to the placoid electrodes 203 so as to apply electrostatic forces to the electrons to cancel out the Lorentz force.

By applying an aperture to the electron flux 507 in the same manner as in FIG. 4(c), electron flux with a controlled spin polarization degree can be obtained.

FIG. 5(b) shows an example in which the electron flux 507 is enlarged once before the electron flux 507 is made incident on the aperture 408. The aperture 408 is irradiated with the enlarged electron flux 508 so that a part of the electron flux passes through. Thus, when the same aperture is used, the spin polarization degree can be more easily controlled than in the case in FIG. 4(c).

Example 4

Figure 6:
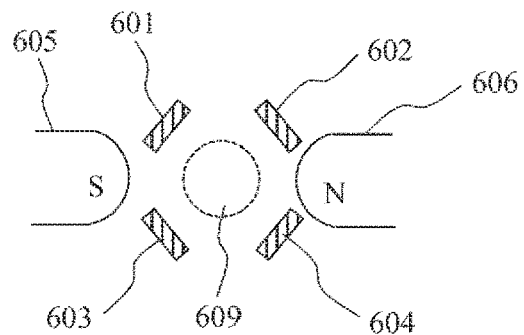
FIGS. 6(a) to 6(c) are a principle diagram showing an electron optical system of Example 4 of the present invention.
Figure 6:
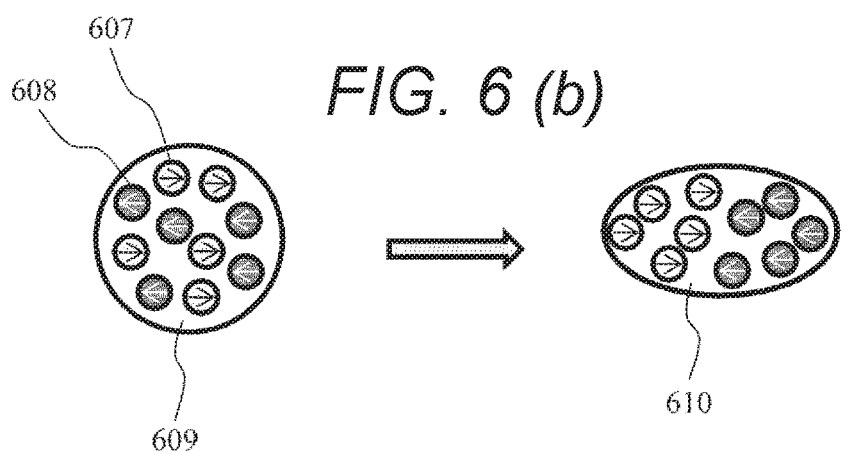
Figure 6:
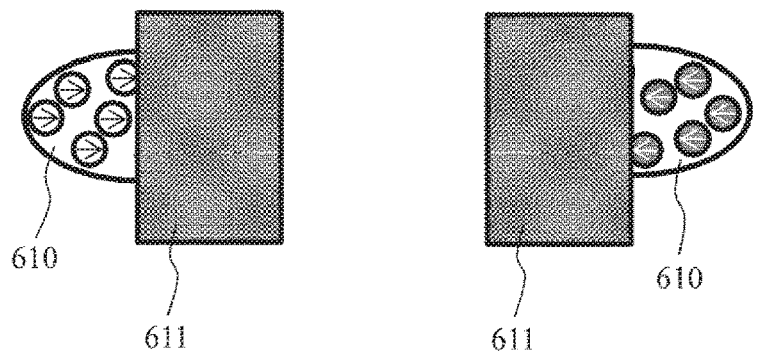

FIGS. 6(a) to 6(c) show Example 4 of the present invention with an electric field created by four placoid electrodes 601, 602, 603 and 604 and a magnetic field created by two magnetic poles 605 and 606 having convex curved surfaces. FIG. 6(b) shows a state in which electrons having leftward and rightward spins on the paper are being deviated laterally while the shape of the beam is laterally isotropic. Herein, the traveling direction of electrons 609 is also the vertical direction to the paper, and the electrons 609 pass through the central portion in FIG. 6(a) from the front to the back of the paper.

The electron flux 609 before being incident on the optical system in FIG. 6(a) is circular, and there is no spin polarization inside. In FIG. 6(a), the potentials of the electrodes 603 and 604 are raised higher (relatively positive potential) than those of the electrodes 601 and 602 so that the electrons receive the electrostatic forces on the lower sides to cancel the upward Lorentz force received from the magnetic poles 605 and 606.

When passing through this electromagnetic field shown in FIG. 6(a), as shown in FIG. 6(b), electrons 607 having rightward magnetic moments receive forces on the left side, and electrons 608 having leftward magnetic moments receive forces on the right side, resulting in spin polarization.

Unlike the examples in FIGS. 4(a) to 5(b), these forces are laterally isotropic. Thus, electron flux 610 after passing through this optical system can be kept circular (elliptical), and spin polarization occurs in which the electrons 607 having rightward spins are deviated to the left side and the electrons 608 having leftward spins are deviated to the right side.

As shown in FIG. 6(c), by shielding the right half or the left half of the electron flux 610 with a shielding plate 611, the spin polarization degree of the passing electrons can be changed. When relative positions of the shielding plate 611 and the electron flux 610 are made variable, the spin polarization degree can be switched. Alternatively, an aperture as shown in FIG. 4(c) may be applied.

Example 5

Figure 7:
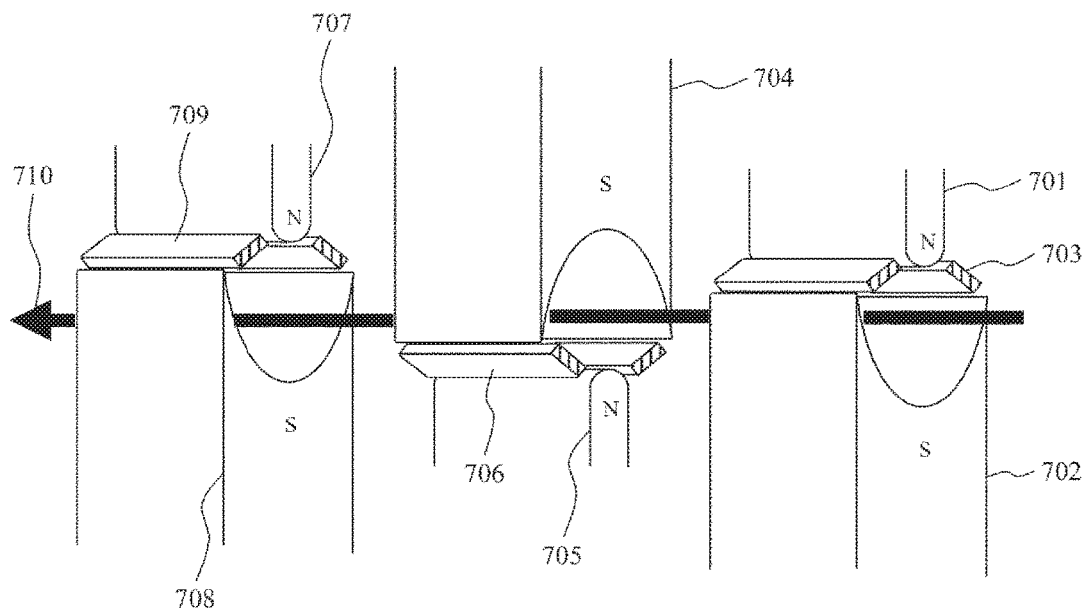
FIG. 7 is a perspective view showing an electron optical system of Example 5 of the present invention.

FIG. 7 shows Example 5 of the present invention. A plurality of combinations of the aforementioned magnetic poles and electrodes shown in FIG. 5(a) are prepared and arranged in an electron trajectory direction. Note that the configuration can also be made by using a plurality of the configurations in FIGS. 4(a) to 4(c) and 6(a) to 6(c). In this example, by arranging several sets of magnetic poles and electrodes (three in this example) in the trajectory direction of the electrons, the change in the trajectories due to spins is enlarged.

When the forces received by the spins of the electrons are not sufficient from a magnetic field gradient of one set of pairs of magnetic poles and electrodes, a plurality of these combinations are prepared to add up the forces received from the magnetic field gradient so that a sufficient change in the trajectories can be obtained.

In this Example, three configurations (units) in FIG. 5(a) are arranged in series, but the configurations in FIG. 4(a) and FIG. 6(a) may be arranged. Electrons are first made incident on magnetic poles 701 and 702 and electrodes 703. Herein, like the aforementioned Examples, the Lorentz force is canceled by electrostatic forces by the electrodes 703.

Thereafter, the electrons are made incident on magnetic poles 704 and 705 and electrodes 706. Herein, the magnetic poles 701 and 702 and 704 and 705 create magnetic fields in reverse directions, and the shapes of the magnetic poles are also reversed. Thus, the density distributions of magnetic field lines are also reversed. As a result, the directions of the magnetic field gradients are the same. Therefore, the directions of the forces received by the spins of the electrons from the magnetic field gradients created by the magnetic poles 701 and 702 and 704 and 705 are the same. However, since the directions of the magnetic fields created by the respective magnetic poles are different, the Lorentz force are in opposite directions and can cancel each other.

In this method, the Lorentz forces can be partially canceled out by the units. Therefore, the scales of the electrodes which give the electrostatic forces can be reduced. Conversely, even if the Lorentz forces cannot be completely canceled by the electrostatic forces, the Lorentz forces can be canceled by adjusting the dispositions of the plurality of electrodes and magnetic poles.

In this Example, the electrons then are made incident on magnetic poles 707 and 708 and electrodes 709. Herein, the direction of the magnetic field created by the magnetic poles 707 and 708 and the gradient of the density of the magnetic field lines are reverse to those created by the magnetic poles 704 and 705. By arranging an appropriate number of combinations of magnetic poles and electrodes in this way, the forces received from the magnetic field gradient are strengthened and the forces received from others such as the Lorenz force can be reduced. Thus, deflection of the trajectories depending on the spins can be enhanced. In all the combinations, it is desirable that optical axes 710 of the electrons coincide.

Example 6

Figure 8:
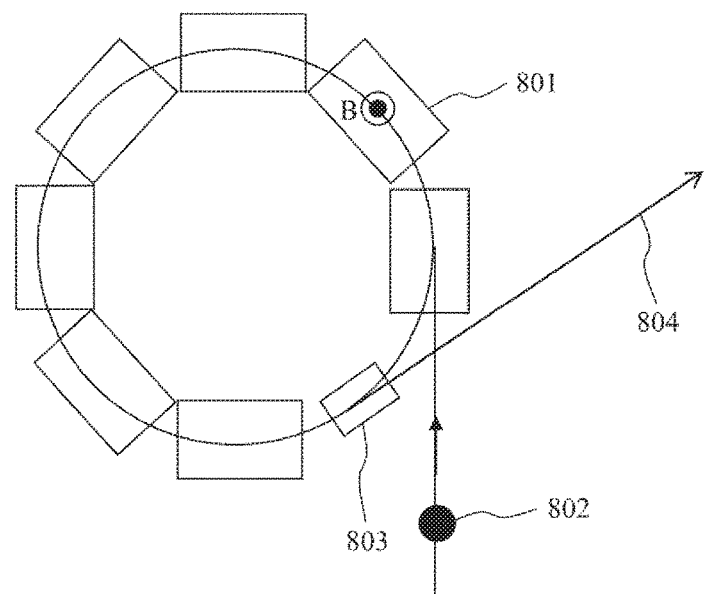
FIG. 8 is a plan view showing an electron optical system of Example 6 of the present invention.

FIG. 8 shows Example 6 of the present invention. This is an example of enhancing the separation of trajectories by spins by disposing a plurality of sets of magnetic poles and electrodes on the circumference and circularly moving electrons therein.

A plurality of units 801 are arranged on the circumference, in which the magnetic poles creating the magnetic field gradient and the configuration for canceling the Lorentz force received by the electrons, which have been described in FIGS. 4(a) to 7, serve as one unit. However, it is necessary to leave a portion on which an electron 802 is made incident.

In this state, the electron 802 is made incident on this circumference, and electromagnetic fields in the units are controlled so that the electron is rotationally moved on the circumference. In the Example, magnetic fields in the units are directed in the vertical direction to the drawing and are expected to decompose the spins in the vertical direction to the drawing. Even though the forces received the spins of the electrons in each unit are weak, the electron repeats the circular motion many times and pass through the plurality of units arranged on the circumference many times so that the forces will appear as a big difference in the trajectory when the forces received by the spins from the magnetic field gradients are appropriately integrated.

Then, when the change in the trajectory becomes sufficiently large, the electron is made incident on an aperture 803 positioned slightly apart from the electron trajectory in the vertical direction to the drawing. By cutting of a desired portion of the electron flux, the spin polarization degree can be improved. Thereafter, the electron is transported in a direction 804 to the optical system which irradiates an observing sample. By utilizing such a circular motion of the electron, the electron trajectory by the spin can be decomposed by integrating the weak forces.

As apparent from the above configurations in FIGS. 2(a) to 7, in these Examples, by electrically controlling the magnetic fields and electric fields to reverse the polarities, the state of the spin polarization can be dynamically switched.

Example 7

An example in which the configurations of the above Examples 1 to 6 are used for a transport optical system will be described. This transport optical system can change courses (trajectories) of charged particles (e.g., electrons) depending on spins. If the change in the courses is sufficiently large, the electron flux is separated into two according to the spins. Alternatively, by keeping the change in the courses small, the deviation of spins (spin polarization) can be generated in one electron flux. By shielding a part of the electron flux having spin deviation, electron flux with a high spin polarization degree can be formed.

By irradiating a sample with such a charged particle beam having a state of spins controlled as a probe and conducting various observations, new discoveries are expected particularly in the field of magnetism.

A probe with which a sample is irradiated can be configured in a way that one electron flux is shielded by a dummy target or the like and the sample is irradiated with the other when a change in the course of the electron flux according to the spins is large and the electron flux is separated into two.

When the change in the course according to the spins is made small, spin deviation occurs in one electron flux. Thus, as shown in FIGS. 4(a) to 4(c) and 6(a) to 6(c), the spin polarization degree of the electron flux can be controlled by shielding a part of the electron flux with the aperture or the like.

As described with FIG. 3, in the method of separating the electron flux into two according to the spins, the electron flux with a large polarization degree can be easily formed, but there is a possibility that the size of the device becomes large. Hereinafter, one example of a transport optical system for irradiating a sample with electron flux having a spin polarization degree controlled by using an aperture will be described.

Figure 9:
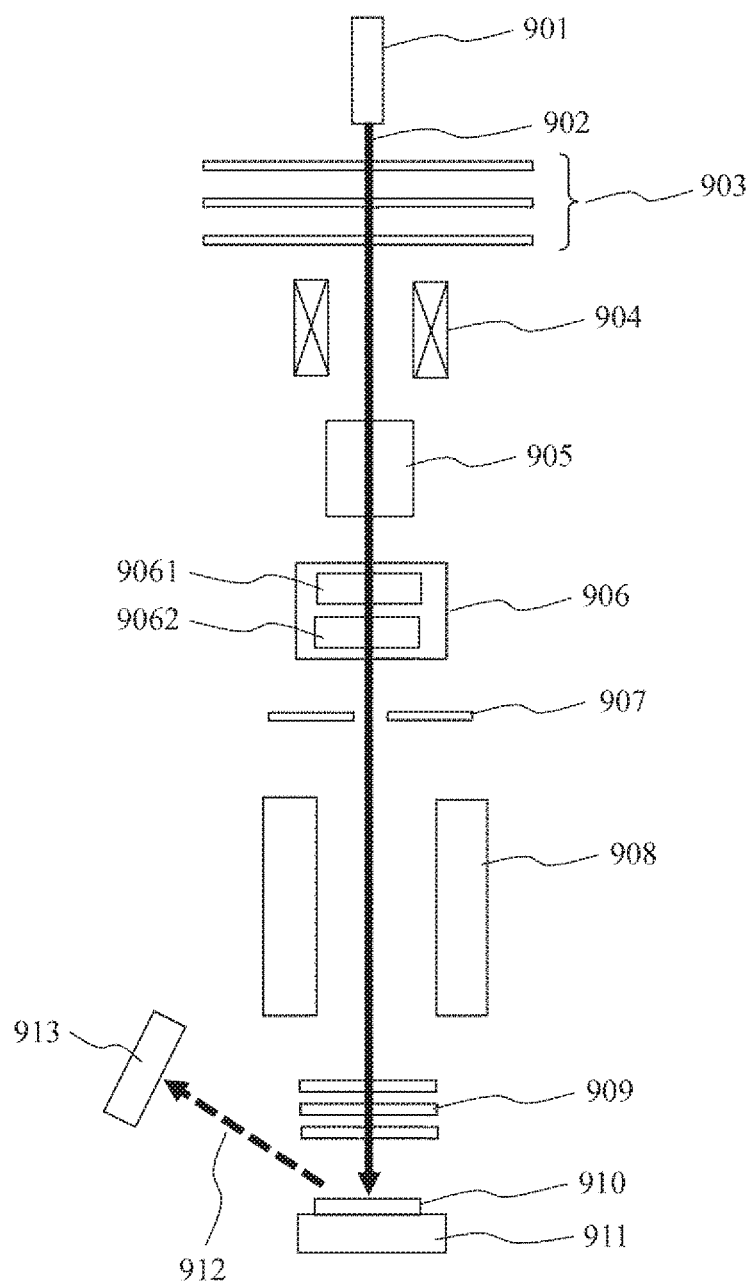
FIG. 9 is a configuration diagram showing a transport optical system of Example 7 of the present invention.

FIG. 9 is a basic configuration diagram showing Example in which the configurations of Examples 1 to 6 are applied to a transport optical system. The transport optical system is generally stored in a space with high degree of vacuum or cleanliness, such as a vacuum chamber. As an electron source 901, various electron sources can be used. By using the aforementioned superlattice of GaAs/GaAsP as the electron source, electron flux with a high spin polarization degree can be formed. Alternatively, a known charged particle source other than electrons may also be used.

Electron flux 902 emitted from the electron source 901 can be efficiently taken out by acceleration electrodes 903 which accelerate the electrons. In addition, condenser lenses 904 and the like for controlling the diameter of the electron flux (probe) and a probe current may be disposed. An optical system between the electron source 901 and a separation optical system 905 can employ a configuration which controls the motions of the electrons with a known electric field or magnetic field. In the example in FIG. 9, electric field type acceleration electrodes 903 and magnetic field type condenser lenses 904 are used.

The separation optical system 905 is a part which gives different trajectories to the electrons of the electron flux depending on the states of the spins. The separation optical system 905 includes a magnetic field generating section which generates a magnetic field having a vertical component to the course of the charged particle flux and an electric field generating section which generates an electric field having a vertical component to the course of the charged particle flux. The course of the charged particle flux can theoretically be represented by the trajectories of the particles at the barycentric position of the charged particle flux in the cross-section. The trajectories of the particles can be industrially considered to be equivalent to the optical axis of the optical system. The separation optical system 905 can be configured with one or a plurality of combinations of the configurations described in FIGS. 2(a) to 8. In the charged particle flux that has emitted out from the separation optical system, the distribution of the charged particles having upward spins and the charged particles having downward spins (i.e., the "distribution" of the spins) is deviated.

The electron flux 902 given the deflection of the trajectory according to the spins in the separation optical system 905 is made incident on an aperture 907 through a control optical system 906. Herein, the aperture 907 is for controlling the spin polarization degree of the electron flux 902, but may also serve as an aperture for an ordinary objective lens, or the aperture for the objective lens may be configured with a different aperture.

The role of the control optical system 906 between the separation optical system 905 and the aperture 907 is to control the electron flux 902 incident on the aperture 907. For example, as shown in FIG. 4(c), to allow a desired portion of the electron fluxes 407, in which electrons having specific spins are unevenly distributed, to highly accurately pass through the aperture 408, it is desirable to adjust the diameter of the electron flux to be large with respect to the diameter of an opening 409 of the aperture as described with FIG. 5(b). Therefore, it is desirable that the control optical system 906 includes an enlarging optical system 9061 for enlarging the diameter of the electron flux.

Note that the enlarging optical system 9061 should at least substantially increase the diameter of the electron flux. The enlarging optical system 9061 includes not only a configuration which intentionally increases the diameter of the electron flux with an electron lens or the like, but also a configuration which simply allows electrons to pass through for a predetermined distance without the disposition of the electron lens or the like since the diameter of the electron flux is also widened spontaneously by the action of the electric charges thereof.

The method of widening the diameter of the electron flux without the disposition of the electron lens or the like has little influence on the distribution of the spins of the electron flux emitted out from the separation optical system 905 and lengthens optical path lengths of the electrons although the configuration is simple.

Moreover, as shown in FIG. 6(c), the spin polarization degree can be changed by changing the transmitting portion of the electron flux 610. That is, by changing the relative position of the electron flux 610 (corresponding to the electron flux 902 in FIG. 9) with respect to the shielding plate 611 (corresponding to the aperture 907 in FIG. 9), the spin polarization degree can be changed and controlled. Therefore, it is desirable that the control optical system 906 includes a deflection optical system 9062. Although the same effect can be obtained even by mechanically moving the aperture, it is mechanistically advantageous to use a deflection optical system.

Moreover, also in the cases as shown in FIGS. 4(c) and 5(b), the spin polarization degree can be controlled by controlling the relative positions of the aperture 907 and the electron flux 902.

Note that there are an electric field type using an electric field and a magnetic field type using a magnetic field for a lens and a deflector configuring an optical system for transporting charged particles. In general, a magnetic field type with good performance is mainly used in an electron microscope, but optical system subsequent to the separation optical system 905 is advantageously configured with the electric field type. It is because, since trajectories of particles with spins are affected by a magnetic field having a gradient, the trajectories change when a magnetic field type optical system is used. Thus, the distribution of the spins controlled by the separation optical system 905 is disturbed. Therefore, there is a possibility that the control for obtaining a desired spin polarization degree becomes complicated particularly when individual elements of the optical system are independently designed and controlled.

On the contrary, either the electric field type or the magnetic field type optical system and a deflector can be optionally placed between the electron source 901 and the separation optical system 905 depending on the performance.

In particular, it is desirable not to place an element, which generates a magnetic field, between the separation optical system 905 and the aperture 907. It is because the distribution of the spins of the electron flux incident on the aperture is disturbed if there is a tilted magnetic field between the separation optical system 905 and the aperture 907. That is, for example, it is difficult to make the electron flux incident on the aperture as shown in FIG. 4(c) while the distribution of the spins is maintained as shown by 407 in FIG. 4(b). Therefore, in the configuration example in FIG. 9, the enlarging optical system 9061 and the deflection optical system 9062, which configure the control optical system 906, employ an electrostatic lens and a deflection electrode, respectively, and a configuration for generating a magnetic field is not placed.

On the other hand, in the optical system subsequent to the aperture 907, when the spin polarization degree is close to 100% by the aperture, there is deviation of the trajectory, but the distribution of the spins in the electron flux is not disturbed. Thus, a magnetic field may be used in consideration of the deviation of the trajectory.

A sample 910 is irradiated with the electron flux 902, which has passed through the aperture 907 and whose spin polarization degree is controlled, through deflectors 908 and objective lenses 909. The sample 910 is generally disposed on a sample holder 911. The sample holder (or sample table) 911 may include a rotation and moving mechanism.

The deflectors 902 control an irradiation position of the electron flux 902 on the sample 910. Moreover, the objective lenses 909 converge the electron flux 902 in a desired diameter and irradiate the sample 910. The smaller the diameter of the electron flux 902 is, the higher the resolution is improved. Note that, as described above, when the optical systems disposed between the separation optical system 905 and the sample 910, such as the deflectors 908 and the objective lenses 909, are configured with deflection electrodes and electrostatic lenses, which are electric field types, the deviation of the trajectory depending on the spins can be ignored.

When this device is used as an analysis device, a state of the sample 910 can be analyzed by detecting with a detector 913 secondary electrons, reflection electrons and other obtained particles 912 emitted from the sample 910 irradiated with the electron flux 902.

Example 8

Figure 10:
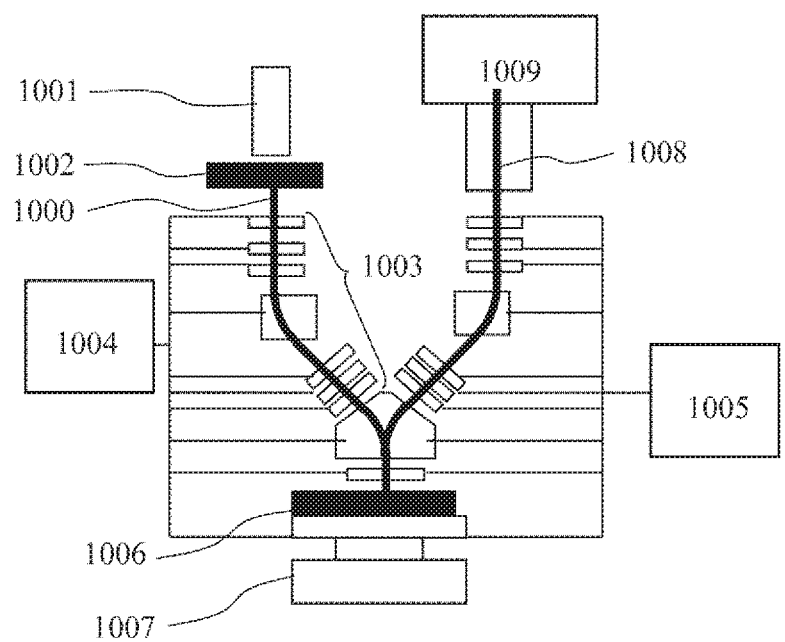
FIG. 10 is a configuration diagram showing a SPLEEM of Example 8 of the present invention.

FIG. 10 shows Example 8 of an analysis device in which the transport optical system of Example 7 is applied to a SPLEEM. In a vacuum chamber, a semiconductor 1002 such as GaAs is irradiated with circularly polarized light from a laser 1001, and a spin-polarized electron beam 1000 is generated. For example, the electron optical systems shown in FIGS. 2(a) to 8 are installed in a part of a subsequent electron lens system 1003 on the irradiation side to improve the spin polarization degree of the spin-polarized electron beam 1000. Thereafter, a sample 1006 placed on a sample stage (may be a sample table or a sample holder) 1007 is irradiated. To the specific configuration of the electron lens system 1003 on the irradiation side, the configuration described with FIG. 9 is applied.

Then, electrons 1008 reflected from the sample 1006 are imaged on a screen 1009. It is preferable that control devices 1004 and 1005 of these lens systems have high levels of stability. If the spin polarization degree of the spin-polarized electron beam 1000 can be adjusted by the electron optical system according to the Example, it is extremely effective for the improvement of the S/N.

Example 9

Figure 11:
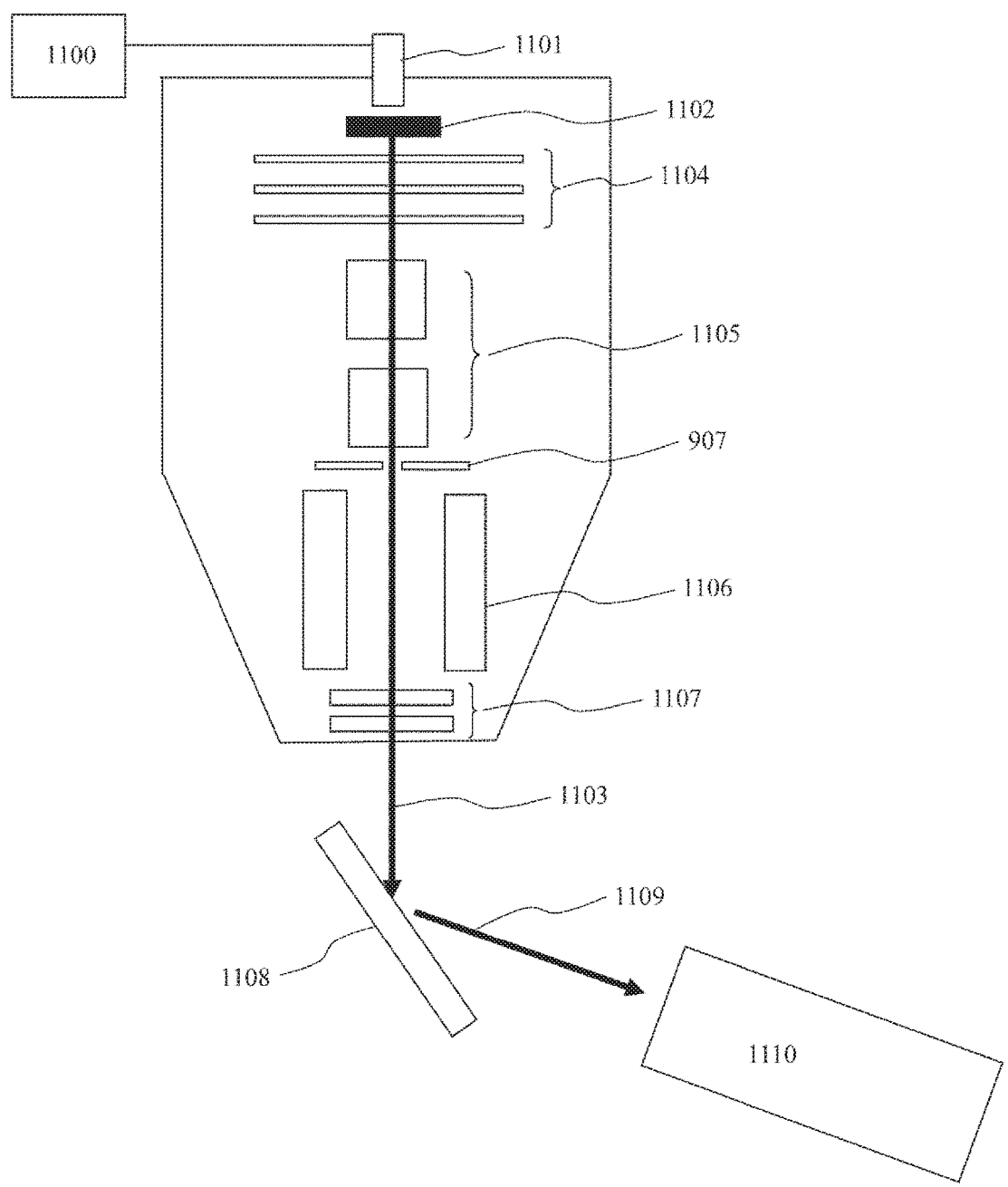
FIG. 11 is a configuration diagram showing a scanning electron microscope of Example 9 of the present invention.

FIG. 11 shows Example 9 of an analysis device in which the spin-polarized electron beam formed by the transport optical system of Example 7 is applied to a scanning electron microscope. The configuration of a conventional scanning electron microscope is disclosed in, for example, PTL 2. An electron source is a spin-polarized electron source and is controlled by an electron beam control device 1100. For example, a type which excites a semiconductor 1102 such as GaAs with circularly polarized light can be considered, and the electron beam control device 1100 controls the wavelength of the excitation light and the direction of the circularly polarized light.

In the Example, the semiconductor 1102 is irradiated with the circularly polarized light emitted from a laser 1101, and a spin-polarized electron beam 1103 is emitted from the semiconductor 1102. After being accelerated by electrostatic lenses 1104, the spin-polarized electron beam 1103 passes through an electron optical system 1105 in which, for example, the configuration in FIG. 5(a) is multiplexed (two in FIG. 11) as shown in FIG. 7, and the spin polarization degree is adjusted by an aperture 907.

Herein, if the acceleration is not increased to about 1 kV or more by the electrostatic lenses 1104, the traveling direction of the emitted electron beam will not be controlled well and spread, and there is a possibility that not all the electrons can reach the sample.

Thereafter, the spin-polarized electron beam 1103 passes through scanning deflection electrodes 1106 and is deflected according to a scanning signal.

Thereafter, the spin-polarized electron beam 1103 is decelerated by electrostatic electrodes 1107, and a sample 1108 is irradiated with the beam 1103 after reaching an acceleration of about 100 V or less. In the configuration in FIG. 11, the scanning deflection electrodes 1106 and the electrostatic electrodes 1107 subsequent to the aperture 907 do not employ a magnetic field.

Apart of the spin-polarized scanning electron beam with which the sample 1108 is irradiated is reflected and becomes reflection electrons 1109. In addition, a part of the beam enters inside the sample, excites electrons inside and generates secondary electrons. The amounts of the reflection electrons and secondary electrons at this time depend on a relationship between the spin polarization degree of the incident electrons and the magnetization of the portion of the sample being irradiated. Thus, by disposing the spin-polarized electron beam, the magnetic sample and an electron detector as shown in the Example and mapping the intensities of the reflection electrons and the secondary electrons, the magnetization direction of the sample can be visualized to analyze the sample.

Also in the example in FIG. 11, the configuration described in FIG. 9 should be applied to the details of the configuration of the transport optical system between the semiconductor 1102, the electron source, and the sample 1108.

Although the electron flux has been described above as an example, the same principle also applies to other charged particles having spins, such as positrons and protons.

The present invention is not limited to the above embodiments and includes various modifications. For example, a part of the configuration of one Example can be replaced with the configuration of other Examples, and the configurations of other Examples can be added to the configuration of one Example. Moreover, addition, deletion and replacement of the configurations of other Examples can be made to a part of the configuration of each example.

REFERENCE SIGNS LIST 101, 201, 301, 701, 705, 707 magnetic pole (N pole)
102, 202, 302, 702, 704, 708 magnetic pole (S pole)
103, 204 magnetic field line
104 neutron
106 the direction of the force the neutron receives from the magnetic field gradient
203, 303, 703, 706, 709 electrode
205 electric field line
206, 304, 802 electron
207 the direction of the force the electron receives from the magnetic field gradient
305 electron detector
401, 501 placoid electrode
402 electric current
403 concentric magnetic field
404 electron having upward magnetic moment
405 electron having downward magnetic moment
406, 506, 609 electron flux before incidence
407, 507, 610 electron flux after passing through
502, 605, 606 magnetic pole having a convex curved surface
503 magnetic pole having a concave curved surface
504, 607 electron having rightward magnetic moment
505, 608 electron having leftward magnetic moment
601, 602, 603, 604 placoid electrode
710 optical axis of electron
801 unit of a magnetic pole which creates a magnetic field gradient and an electrode which cancels the Lorentz force
408, 803, 907 aperture
1000, 1103 spin-polarized electron beam
1003 electron lens system on the irradiation side including the electron optical system according to Examples of the present invention
1004, 1005 control device for electron lens system
910, 1006, 1108 sample
1104 electrostatic lens
1105 electron optical system according to Examples of the present invention

The invention claimed is:

1. A charged particle device, comprising:
a charged particle source which generates charged particles;
a sample table on which a sample is placed; and
a transport optical system which is disposed between the charged particle source and the sample table and is configured to transport the charged particles as charged particle flux toward the sample table, the transport optical system comprising a magnetic field generating section which generates a magnetic field having a perpendicular component to a course of the charged particle flux;
an electric field generating section which generates an electric field having a perpendicular component to the course of the charged particle flux; and
a shielding section which shields at least a part of the charged particle flux passed through the magnetic field generating section and the electric field generating section; and
a separation optical system comprising the magnetic field generating section and the electric field generating section,
wherein the perpendicular component of the magnetic field has a magnetic field gradient,
wherein the perpendicular component of the electric field provides an electrostatic force in a direction opposite to a Lorentz force received by the charged particle flux,
wherein the charged particle flux emitted out from the separation optical system have deviated distribution of the charged particles having upward spins and the charged particles having downward spins, and
wherein the shielding section increases a spin polarization degree of the charged particle flux by the shielding.

2. The charged particle device according to claim 1, comprising, between the separation optical system and the shielding section, an enlarging optical system which enlarges a cross-sectional area of the charged particle flux shielded by the shielding section.

3. The charged particle device according to claim 1, comprising, between the separation optical system and the shielding section, a deflector which changes relative positions of the charged particle flux and the shielding section.

4. The charged particle device according to claim 1, comprising, between the separation optical system and the shielding section, a control optical system which controls a condition of the charged particle flux incident on the shielding section by the electric field.

5. The charged particle device according to claim 4, not comprising an optical system or a deflector creating the magnetic field between the separation optical system and the shielding section.

6. The charged particle device according to claim 5, comprising at least one of the optical system and the deflector creating the magnetic field between the charged particle source and the separation optical system.

7. The charged particle device according to claim 1,
wherein the separation optical system comprises:
a first unit comprising a set of a first magnetic field generating section and a first electric field generating section; and
a second unit comprising a set of a second magnetic field generating section and a second electric field generating section, and
the first unit and the second unit are disposed along the course of the charged particle flux and have a direction of the magnetic field gradient, the perpendicular component of the magnetic field, and the perpendicular component of the electric field, which are reverse to each other.

8. A charged particle irradiation method for irradiating a sample with charged particles having spins, the charged particle irradiation method comprising:
generating an electric field and a magnetic field, each having a component perpendicular to trajectories of the charged particles and perpendicular to each other, wherein the magnetic field has a magnetic field gradient at a position of the trajectories of the charged particles, wherein the electric field is applied so as to weaken a Lorentz force received by the charged particles, wherein the magnetic field gradient gives the charged particles a change in the trajectories according to the spins thereof, wherein a flux of the emitted charged particles has a deviated distribution of the charged particles having upward spins and the charged particles having downward spins, and wherein the method further comprises increasing a spin polarization degree of the charged particle flux using a shielding section.

9. The charged particle irradiation method according to claim 8, further comprising:

arranging a first unit comprising a combination of a first electrode and a magnetic pole and a second unit comprising a second electrode and a magnetic pole in a direction of the trajectories of the charged particles to generate the electric field and the magnetic field, and reversing a direction of the magnetic field gradient, the magnetic field, and the electric field which are formed by the first unit with respect to a direction of the magnetic field gradient, the magnetic field, and the electric field which are formed by the second unit.

10. The charged particle irradiation method according to claim 9, further comprising:

arranging the first unit and the second unit on a circumference; and rotating the charged particles a plurality of times on the circumference to change the trajectories according to the spins by the magnetic field gradient.

11. The charged particle irradiation method according to claim 8, further comprising controlling a spin polarization degree of the charged particles with which the sample is irradiated by shielding a part of the charged particles after the change in the trajectories according to the spins is given.

12. The charged particle irradiation method according to claim 11, further comprising controlling a configuration used after the spin polarization degree of the charged particles is controlled until the part of the charged particles that is shielded does not employ an optical system or a deflector which uses a magnetic field.

13. An analysis device, comprising:

a charged particle source which generates charged particles;

a sample table on which a sample is placed; and a transport optical system which is disposed between the charged particle source and the sample table and which is configured to transport the charged particles as charged particle flux to the sample, wherein the transport optical system comprises a separation optical system, an aperture and an objective lens, the separation optical system comprising a magnetic field generating section which generates a magnetic field having a perpendicular component to a course of the charged particle flux, the perpendicular component having a gradient; and an electric field generating section which generates an electric field having a perpendicular component to the course of the charged particle flux and the perpendicular component of the magnetic field, wherein the aperture increases a spin polarization degree of the charged particle flux by shielding a part of the charged particle flux passed through the separation optical system, wherein the objective lens converges the charged particle flux to irradiate the sample, wherein the analysis device further comprises a detector which observes particles reflected or generated from the sample by the irradiation;

an enlarging optical system disposed between the separation optical system and the aperture and configured to enlarge a diameter of the charged particle flux by a static lens or spontaneous spreading of the charged particles; and a control optical system comprising at least one deflection electrode.

* * * * *